(12) United States Patent
Pratt

(10) Patent No.: US 10,039,020 B2
(45) Date of Patent: Jul. 31, 2018

(54) DOMINANT SIGNAL DETECTION METHOD AND APPARATUS

(71) Applicant: ANALOG DEVICES GLOBAL, Hamilton (BM)

(72) Inventor: Patrick Joseph Pratt, Mallow (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/517,447

(22) Filed: Oct. 17, 2014

(65) Prior Publication Data

US 2015/0289154 A1 Oct. 8, 2015

(30) Foreign Application Priority Data

Apr. 8, 2014 (GB) .................................. 1406340.8

(51) Int. Cl.
| | |
|---|---|
| *H04B 17/00* | (2015.01) |
| *H04W 24/08* | (2009.01) |
| *G01L 23/16* | (2006.01) |
| *H03J 1/00* | (2006.01) |

(52) U.S. Cl.
CPC ............. *H04W 24/08* (2013.01); *G01L 23/16* (2013.01); *H03J 1/0091* (2013.01)

(58) Field of Classification Search
CPC .................................................... H04W 24/08
USPC ...................................................... 455/67.14
See application file for complete search history.

(56) References Cited

U.S. PATENT DOCUMENTS

| | | | | |
|---|---|---|---|---|
| 4,635,278 A | * | 1/1987 | Maloon | H04L 27/28 370/210 |
| 5,271,038 A | | 12/1993 | Cai | |
| 5,812,611 A | | 9/1998 | Sogabe | |
| 6,038,433 A | * | 3/2000 | Vegt | H03J 1/0091 455/161.1 |
| 6,792,047 B1 | * | 9/2004 | Bixby | H04N 21/23424 375/240.26 |

(Continued)

FOREIGN PATENT DOCUMENTS

| | | |
|---|---|---|
| CN | 101094487 | 12/2007 |
| CN | 101502007 | 8/2009 |

(Continued)

OTHER PUBLICATIONS

Japanese Office Action dated May 9, 2017 for Japanese Patent Application No. 2015-078421, 8 pages with translation.

(Continued)

*Primary Examiner* — Raj Chakraborty
(74) *Attorney, Agent, or Firm* — Knobbe, Martens, Olson & Bear, LLP

(57) ABSTRACT

A single complex calculation for locating a dominant frequency, such as an interfering signal in a frequency range, is replaced by several much easier ones. A signal is analyzed over a first frequency range to locate at least one comparatively significant frequency component therein. This can involve analyzing, using electronic hardware, a test range of frequencies to identify a potentially significant component within the test range; and determining, using electronic hardware, if a condition for finishing the analysis has been met. If the condition has not been met, the test range is modified as a result of the analysis and the operations of analyzing and determining are repeated.

33 Claims, 12 Drawing Sheets

(56) References Cited

U.S. PATENT DOCUMENTS

| | | | |
|---|---|---|---|
| 7,346,134 B2 | 3/2008 | Smith | |
| 7,680,476 B2 | 3/2010 | Tränkle | |
| 7,840,384 B2 | 11/2010 | Feldhaus et al. | |
| 8,358,993 B2 | 1/2013 | Quinlan et al. | |
| 2007/0021091 A1 | 1/2007 | Trankle | |
| 2008/0039045 A1 | 2/2008 | Filipovic et al. | |
| 2008/0171527 A1* | 7/2008 | Masoian | H04B 7/15542 455/307 |
| 2009/0086864 A1* | 4/2009 | Komninakis | H04B 1/10 375/346 |
| 2009/0096514 A1 | 4/2009 | Xu et al. | |
| 2009/0245176 A1* | 10/2009 | Balasubramanian | H04W 48/20 370/328 |
| 2009/0245276 A1* | 10/2009 | Manne | H04M 11/066 370/466 |
| 2010/0095180 A1 | 4/2010 | Sawai | |
| 2011/0286618 A1* | 11/2011 | Vandali | A61N 1/36032 381/320 |
| 2013/0208838 A1 | 8/2013 | Wu et al. | |
| 2013/0249720 A1 | 9/2013 | Matsuura et al. | |
| 2015/0146769 A1* | 5/2015 | Omer | H04L 25/03159 375/232 |
| 2015/0288399 A1 | 10/2015 | Pratt | |

FOREIGN PATENT DOCUMENTS

| | | |
|---|---|---|
| CN | 101971506 | 2/2011 |
| CN | 102318371 | 1/2012 |
| DE | 10 2005 008734 | 8/2006 |
| EP | 1 267 496 | 12/2002 |
| JP | 2001-111457 | 4/2001 |
| JP | 2001-159603 | 6/2001 |
| JP | 2007-013984 | 1/2007 |
| JP | 2007-240170 | 9/2007 |
| JP | 2008-145374 | 6/2008 |
| JP | 2010-093711 | 4/2010 |
| JP | 2011-509046 | 3/2011 |
| JP | 2012-177581 | 9/2012 |
| KR | 10-2004-0004572 | 1/2004 |
| KR | 10-2009-0039834 | 4/2009 |
| KR | 10-2010-0096273 | 9/2010 |
| WO | WO 02/093807 | 11/2002 |
| WO | WO 2011-004578 | 1/2011 |

OTHER PUBLICATIONS

Korean Office Action dated May 4, 2017 for Korean Patent Application No. 2017-29124, 18 pages with translation.
Korean Office Action dated Oct. 5, 2016 for Korean Patent Application No. 10-2015-0048876, filed Apr. 7, 2015, 6 pages and 5 page translation.
Japanese Office Action dated Dec. 21, 2015 for Japanese Patent Application No. JP 2015-078421 filed Apr. 7, 2015. 5 pages, 8 page translation.
Japanese Office Action dated Sep. 13, 2016 for Japanese Application No. 2015-078421, filed Apr. 7, 2015, 3 pages and 5 page translation.
Liu, Bede & Mintzer, Fred, "Calculation of Narrow-Band Spectra by Direct Decimation," IEEE Transactions on Acoustics, Speech, and Signal Processing, vol. ASSP-26, No. 6, Dec. 1978, pp. 529-534.
Prabhu, A.V., et al., "Frequency Zooming Techniques for High Resolution Spectrum Analysis", Def Sci. J., vol. 35, No. 3, Jul. 1985, pp. 281-285.
Nawrocki, C.W. & Ferrie, James F., "Zoom FFT—An Approximate Vernier Frequency Algorithm," dated Nov. 22, 1972 and filmed in Oct. 1977. Available at: http://www.dtic.mil/cgi-bin/GetTRDoc?Location=U2&doc=GetTRDoc.pdf&AD=ADA044461 (accessed: Aug. 12, 2016).
Korean Office Action dated Apr. 12, 2016 for Korean Patent Application No. 10-2015-0048876, filed Apr. 7, 2015, 8 pages and 7 page translation.
European Search Report dated Nov. 10, 2015 for European Patent Application No. 15161450.0, filed Mar. 27, 2015. 6 pages.
Korean Office Action dated Dec. 7, 2016 for Korean Patent Application No. 10-2015-0048876, filed Apr. 7, 2015, 8 pages and 8 page translation.
Office Action dated Nov. 27, 2017 for counterpart Chinese Patent Application No. 201510159671.7, 13 pages.
European Office Action dated Apr. 19, 2018 for European Patent Application No. 15161450.0, filed Mar. 27, 2015, 5 pages.

* cited by examiner

DOMINANT SIGNAL DETECTION METHOD AND APPARATUS

RELATED APPLICATION

This application claims the benefit of G.B. Patent Application No. 1406340.8, filed on Apr. 8, 2014, the entire disclosure of which is hereby incorporated by reference herein.

TECHNICAL FIELD

The present disclosure relates to a method of and apparatus for finding a dominant signal within a given frequency range and/or to finding at least one significant signal within the given frequency range.

BACKGROUND

There are many applications where it is desirable to locate a signal and possibly to track it as it varies in frequency. Such applications range from relatively low frequencies, such as in power line monitoring where it is desired to find the power line frequency to a desired accuracy, to high frequencies as found in modern communication systems, such as modern mobile telephony systems (although in this context this is to be understood to encompass speech and/or data transmission).

The field of mobile telephony is an example of a system where signal power received at a receiver may vary significantly. The receiver may be a base station trying to communicate with a mobile device at the edge of the cell covered by the base station, and hence the received signal may be relativel y weak. Meanwhile a handset on another operator's network may be working on a similar frequency and be close to the base station such that its signal at the base station is relatively large. Such a signal can be referred to as a "blocker" or interferer, as it may degrade or inhibit what would otherwise be a viable reception of a desired signal. Similar problems may occur for devices trying to receive a signal from a base station and/or in a point to point communications system.

It is advantageous to be able to locate the frequency of the dominant signals and/or blockers. This may enable action to be taken to mitigate the effects of a blocker. For example, by estimating the interference that may occur due to the presence of a blocker and generating a signal to reduce or correct for that interference.

SUMMARY OF CERTAIN INVENTIVE ASPECTS

In a first aspect of this disclosure there is provided a method of identifying dominant or significant frequency components within an input signal. This method is implemented using electronic hardware. The method may comprise a plurality of iterations. In an iteration, a number of operations are performed. A test range of frequencies is selected from the input signal spanning a first frequency range, where the first frequency range represents a range of interest. Selecting the test range may be achieved by filtering the input signal to attenuate frequencies outside of the test range. The frequencies within the test range are analyzed to determine the presence of a dominant frequency component or at least one significant frequency component. If such a frequency component is identified then the frequency of the dominant or at least one significant signal component is estimated. The estimate of frequency is then used in a subsequent iteration with a different range of the test range of frequencies. This iteration may include adjusting the center frequency of the test range and/or the bandwidth of the test range. The test range may be regarded as being synonymous with a search range.

The process can be repeated until the dominant signal has been identified to a sufficient degree of accuracy or until a sufficient number, and preferably a predetermined number, of iterations have been completed.

It is also possible to repeat the process based on the knowledge of previously found significant frequency components to look for other significant signals in addition to any previously identified components by directing the search away from them.

The frequencies within the test range may be examined by an analysis engine. The analysis engine may comprise a Fourier transform engine. Alternatively the analysis engine may comprise a parametric engine. The parametric engine may, for example, be arranged to perform Levinson recursions to solve a matrix, such as a Toeplitz matrix.

It is thus possible to provide a method of analyzing an input signal to locate a dominant frequency within a frequency search range, comprising: dividing the frequency search range into a plurality of regions; analyzing the signal strength within each region to identify a candidate region with the greatest likelihood of containing the dominant signal; and defining a new frequency search range to search. The new frequency search range can be reduced in size compared to the preceding frequency search range, and including the candidate region. The operations of dividing, analyzing, and defining can be repeated until a desired frequency resolution has been achieved. In a first iteration the frequency search range (the test range) may correspond to the first frequency range.

In an embodiment a method of locating a dominant signal comprises recursively performing a search in which a frequency search range between a lower frequency $LF_K$ and an upper frequency $UF_K$ is divided into Y frequency bins, and an input signal is analyzed to identify the magnitude of signals occurring in each of the frequency bins. Once a frequency bin $Ymax_{(K)}$ having the greatest signal magnitude has been located, the bin central frequency can be output as a result if the bin width is below a predetermined frequency range representing an acceptable frequency resolution. The value K represents an iteration count.

If an acceptable resolution has not been reached, then a further search is performed in which the frequency search range is narrowed to a new lower frequency $LF_{KA}$ and a new upper frequency $UF_{K+1}$ where the range between $UF_{K+1}$ and $LF_{KA}$ encompasses the entirety of the frequency range of bin $Ymax_{(K)}$ and $UF_{K+1}-LF_{K+1}$ is less than $UF_K-LF_K$.

Advantageously, the signal being analyzed has been converted to, or already existed, in the digital domain. The digital signal may be decimated. A decimation rate applied to signals being searched can be varied at each iteration K in order to vary the resolution of the search.

The frequency search range may be selected by changing the center frequency (pass band center frequency) of a digital filter. In principle given a known frequency search range and a known desired resolution, filter center frequencies and filter bandwidths could be predetermined and coefficients for a particular filter implementation calculated or looked up. However it is also possible to select the frequency search range by employing frequency translation techniques, e.g., down conversion, to place the frequency range of interest into a given frequency space for each iteration. For example the lowest frequency could be translated to substantially 0 Hz at each iteration, and then the filter high-frequency cut-off point can be set to control the filter bandwidth.

Either of the above approaches for changing the search range and narrowing it can be thought of as "zooming in" to a region of the frequency space.

In an embodiment the method comprises: positioning the frequency test range to encompass a frequency range of a Fast Fourier Transform (FFT) bin having a maximum magnitude identified in a previous iteration of the method (or for the first iteration the entire first frequency range); reducing the pass band of a filter to the bandwidth of an FFT bin of the previous iteration, plus a guard band (or for the first iteration the entire first frequency range); reducing a sample rate to the FFT so that each FFT bin covers a reduced frequency range; performing a FFT; identifying the FFT bin having a maximum magnitude, and a frequency parameter associated with that bin; and repeating successive iterations of said positioning, said reducing the pass band, said reducing the sampling rate, said performing, and said identifying until a FFT bandwidth is reduced to a desired resolution.

The guard band may range from substantially zero Hz upwards. The guard band may be set to be a proportion of the current bin width, such as half the size or more than the current bin width. The frequency test or search space may be centered about the center frequency of the FFT bin having the maximum amplitude.

In a further variation there is provided a method of searching for at least one significant frequency or a dominant frequency within a first frequency range, comprising selecting a test range from the first frequency range, and analyzing signals within the test range using a parametric method to estimate the dominant or at least one significant frequency within the test range, and on the basis of the estimate refining the test range.

Advantageously, the test range can be selected by a band pass filter, or a low pass filter which may work in combination with a frequency translator. Alternatively, the test range can be defined by the operation of series connected filters to synthesize a band pass filter.

Preferably, the parametric engine is arranged to solve Yule-Walker equations of Mth order. The value of M can define the number of significant frequency components that can be identified by the parametric engine.

Preferably, M is kept to a relatively small integer in order to reduce the computational burden within the parametric engine. M may be less than 10. Advantageously, M can be less than 5. In an embodiment M=1, which is computationally efficient.

The parametric engine may work iteratively to locate the dominant frequency component within the input signal.

According to a second aspect of this disclosure there is provided dominant signal detection apparatus arranged to recursively or iteratively search an input frequency range of an input signal, and at each pass to search a reduced frequency search range identified in a previous pass as containing a dominant signal, and to continue until a frequency of the dominant signal has been estimated to a predetermined accuracy.

Advantageously, the apparatus can comprise a search-space/test-range controller for defining and/or applying a pass band to the frequency search space, and a spectrum analysis engine for allocating spectral power within the search space into a plurality of frequency bins. The search space controller may comprise a frequency converter for mapping a variable frequency search range into a predetermined frequency range, for supply to a controllable bandwidth filter. The frequency search range in each Kth iteration of the search may be divided into Y frequency bins, and an input signal is analyzed to identify the magnitude of signals occurring in each of the bins. Once a bin $Ymax_{(K)}$ having the greatest signal magnitude has been identified, the bin central frequency can be output as a result if the bin width is below a predetermined frequency range representing an acceptable frequency resolution. Advantageously, the input frequency is the frequency translated by a different amount at each iteration such that signals in the frequency range corresponding to $Ymax_{(K)}$ are mapped into the frequency space that enables the use of a fixed frequency (for example with a center frequency of 0 Hz) variable bandwidth filter, e.g., a low pass filter.

The spectral analysis engine may comprise a low N-point Fast Fourier Transform (FFT) engine. Such an engine may be provided as dedicated hardware and work on as little as 2, 3 or 4 buffered signals, that is 2, 3 or 4 samples of the signal being analyzed. Such low N-point FFT engines are available to work in the digital domain on digital signals and also in the analog domain on analog signals. A controller may examine the output of the FFT engine to identify a bin having a maximum signal modulus. The controller has knowledge of the search algorithm that is being executed and hence can estimate the range of frequencies mapped into the bin $Ymax_{(K)}$. The controller uses this information to set the operation of the frequency converter and the bandwidth of the filter to ensure that a next search is centered about and substantially limited to the frequency range corresponding to bin $Ymax_{(K)}$.

Alternatively, the spectral analysis engine may comprise a parametric engine. In such an arrangement the parametric engine analyses the signals provided to it to identify the M most significant signals, where M is an order of the parametric engine. The parametric engine can be used to perform an iterative search where in each iteration the frequency of a dominant signal is estimated, and in a subsequent iteration the search is performed within a reduced search space or test-range based on the estimate from the present iteration.

According to a further aspect there is provided a receiver comprising a dominant signal detection apparatus. Advantageously, the dominant signal detection apparatus is arranged to look for a harmonic of a blocker signal, where the harmonic occurs within a digitized signal. The receiver may be implemented in a telecommunications device, such as a radio, a wireless modem, a telephone, a base station, etc.

BRIEF DESCRIPTION OF THE DRAWINGS

Embodiments of the present disclosure will now be described, by way of non-limiting example, with reference to the accompanying drawings, in which.

DETAILED DESCRIPTION OF CERTAIN EMBODIMENTS

Figure 1:
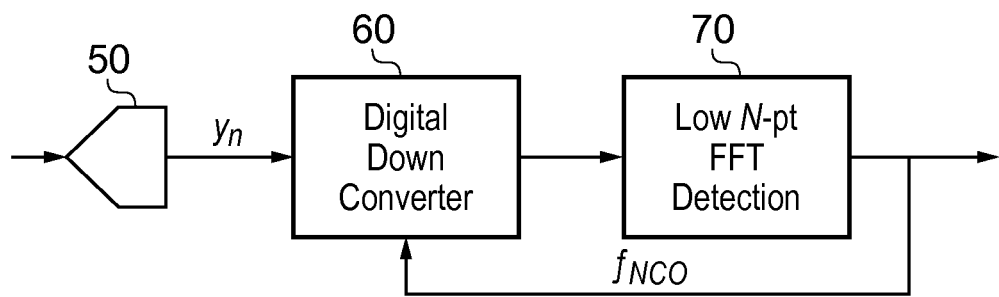
FIG. 1 is a schematic diagram of an apparatus for detecting a dominant signal.

FIG. 1 is a block diagram of a signal processing system arranged to find a dominant signal, such as a blocker signal within a bandwidth limited signal covering a first frequency range. Thus, for example, if the system of FIG. 1 was implemented within a receiver, the incoming radio signal may have been amplified and down converted to base band or to a low intermediate frequency. The down converted signal may then be supplied to the input of an analog to digital converter 50. However, in such an arrangement the transmitter from which the receiver receives a signal may not provide the strongest signal that the receiver receives. A much stronger signal, sometimes known as a blocker signal or an interferer signal, may be present.

Alternatively, the input to the analog to digital converter 50 may be supplied by monitoring and/or instrumentation apparatus.

Figure 7:
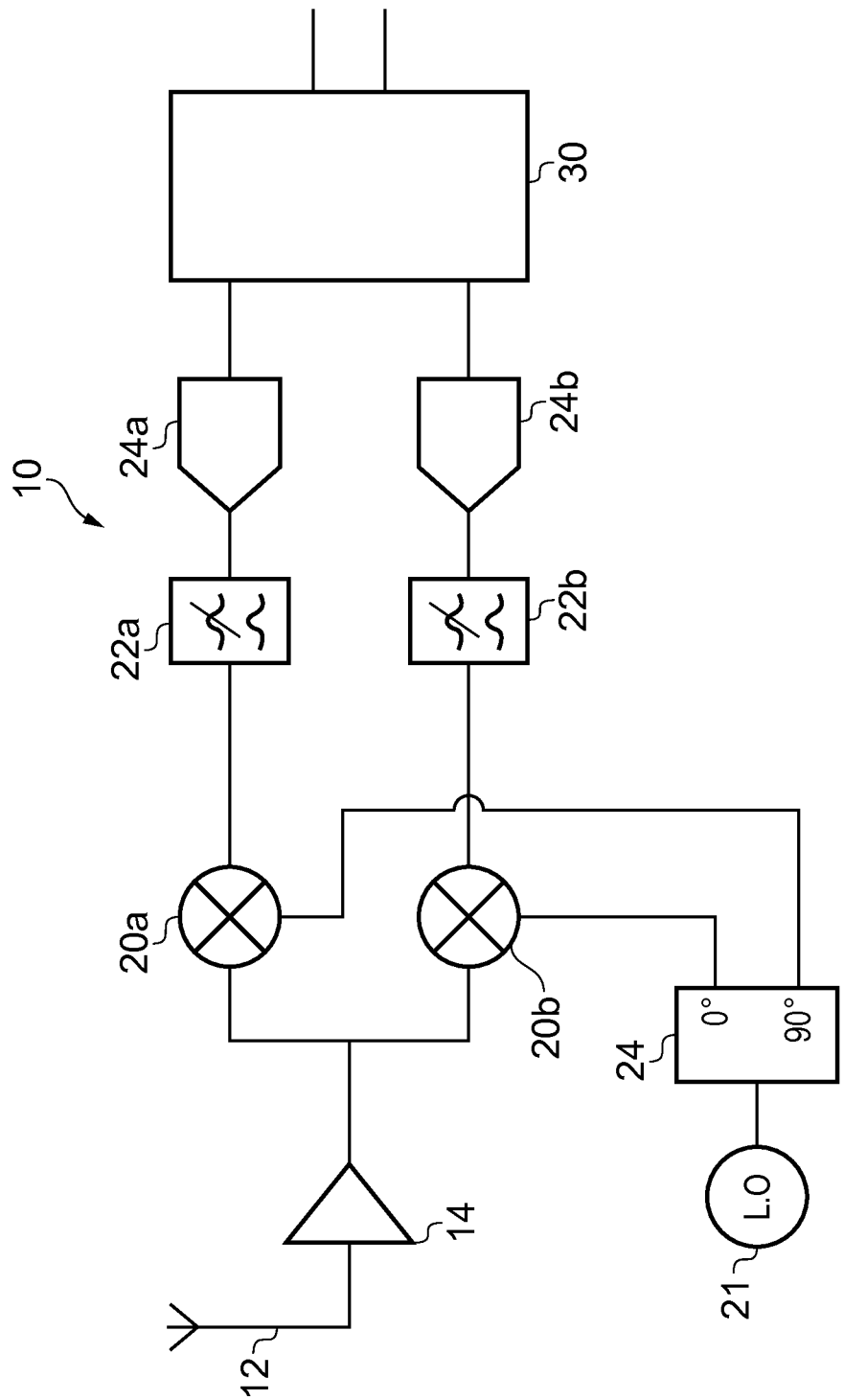
FIG. 7 schematically illustrates a radio receiver.

It may be beneficial, for some readers, to briefly consider the operation of a radio receiver in order to more clearly set out why a blocker signal can be a problem. FIG. 7 schematically illustrates some components of a radio receiver, for example of the type used in mobile telephony (e.g., 3G, 4G, LTE), for example in a base station. An antenna 12 receives an incoming radio signal. An incoming "wanted" radio signal may have to compete to be received with various other signals originating in the environment. In some cases the "wanted" signal may be a mobile telephone signal where the mobile telephone is located at the edge of the base station cell. Meanwhile other mobile telephones may be located much closer to the antenna 12 resulting in their signal power at the antenna 12 being much greater than the wanted signal in this example. These unwanted signals from other devices may interfere with or block the wanted signal. As known to the person skilled in the art, in code division multiplex systems, the individual signals to and from the mobile telephones or other devices share the same frequency space but are encoded by orthogonal codes such that each signal should appear as noise to each other signal. However, different mobile phone frequency bands are also allocated, and it is possible for signals on those bands to bleed into and interfere with a wanted signal due to non-linearities in the receiver.

The antenna 12 is connected to a radio frequency (RF) amplifier 14, such as a low-noise amplifier, which amplifies the wanted and unwanted signals, and passes the amplified signals to mixers 20a and 20b of a quadrature receiver. Each mixer 20a and 20b receives the same signal from the RF amplifier 14. Each mixer 20a and 20b also receives the same signal from a local oscillator 21, except for the fact that a phase shifter 24 is provided in the signal path so that the mixers 20a and 20b receive local oscillator signals which are nominally 90° out of phase. For convenience, the unshifted signal is known as the in-phase signal I and the 90° phase shifted signal is known as the quadrature signal Q. The incoming RF signal is mixed with the local oscillator signal to frequency shift and down convert it for subsequent processing. The local oscillator signal may be selected so as to mix the wanted signal down to a low intermediate frequency, or in direct conversion architectures it may selected to match the frequency of the incoming RF signal such that the output of the mixers 20a and 20b represents the baseband signal. The down converted signal from the mixers 20a and 20b is then passed to respective low pass filters 22a and 22b, and then to respective analog to digital converters 24a and 24b, which may be separate devices or may be provided by a single analog to digital converter working in a time multiplexed manner. The analog to digital converters 24a and 24b provide a stream of digitized signals to a digital baseband processor 30. Track and hold or sample and hold blocks may be provided between the filters 22a, 22b and the analog to digital converters 24a and 24b if desired, but may not be included depending on the converter architecture.

Although the designers seek to make the amplifiers and mixers, and indeed the analog to digital converters, as linear as possible, any non-linearity within these components may give rise to frequency mixing. In particular, if a strong signal is received at the antenna 12, which is offset from the desired signal by, say, frequency 61, then non-linear mixing of that interfering signal with itself can give rise to the potential for an image of the interfering signal to become aligned in frequency with the wanted signal.

If the frequency of the potential interfering signal could be identified, then it would be possible to isolate it from the incoming received signals, and use it to generate a cancellation signal which could be then re-injected back into the signal path, either in the analog or digital domains, in order to reduce the effect of the interfering signal.

It is therefore desirable to find a method and implementation of that method for identifying the frequency of the potential blocker. As noted above, FIG. 1 shows a first embodiment of an arrangement for identifying a potential blocker, which can be implemented in a radio receiver similar to that of FIG. 7.

In the arrangement shown in FIG. 1, the functions implemented within the signal processing system are described in terms of hardware, although it should be evident that since all the operations are being performed on digital signals or words, the operations may be performed in dedicated hardware or reusable/multipurpose computational engines and/or software. Any reference to "software" herein can refer to instructions stored in non-transitory memory that are executable by a processor. Further several of the functional blocks described herein may be performed by a single device. The output of the analog to digital converter 50 (which may be the converters 22a and 22b described with respect to FIG. 7) is provided to a down converter 60 in FIG. 1. As illustrated, the output of the down converter 60 is provided to a spectral analysis engine 70, such as a low N point fast Fourier transform engine, which may be implemented in dedicated hardware and/or software as implemented by instructions stored in non-transitory memory that are executed by a processor. Similarly, the down converter 60 (which more generally is a frequency translator) can also be implemented in dedicated hardware and/or software. The output of the spectral analysis engine 70, whether that be implemented in hardware or software, is then fed back to control the operation of the digital down converter 60 in FIG. 1.

Figure 2:
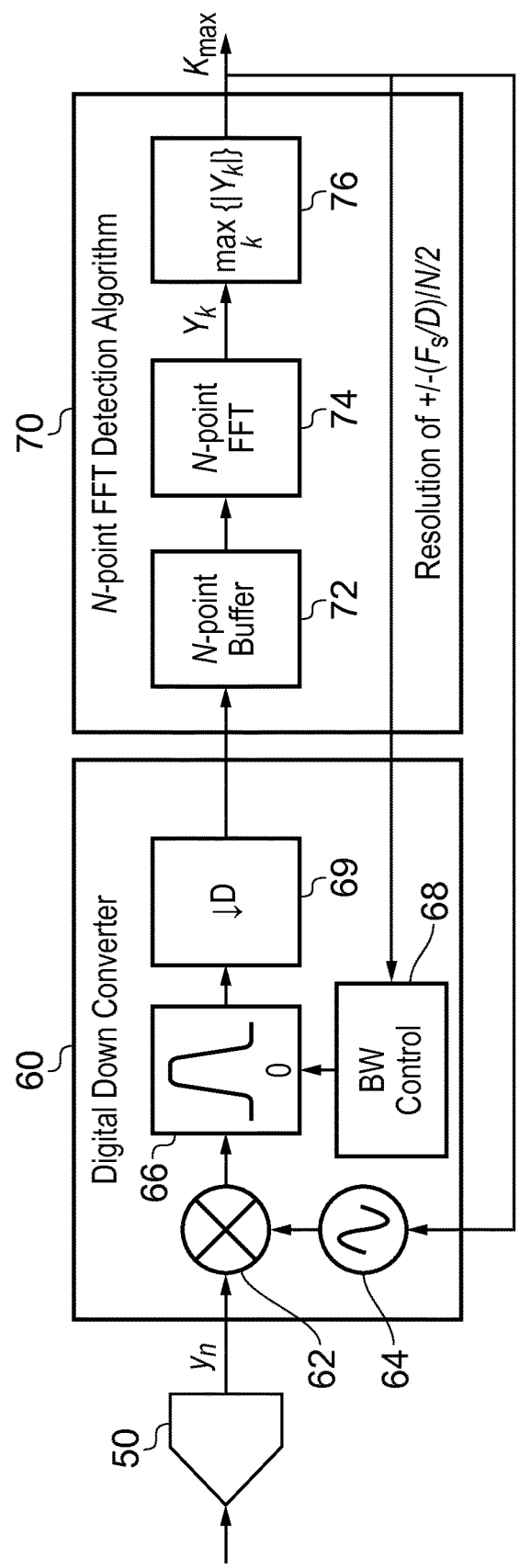
FIG. 2 is a schematic diagram showing components of the apparatus of FIG. 1 in greater detail.

The digital down converter 60 and the spectral analysis engine 70 of FIG. 1 are shown in greater detail in FIG. 2. In FIG. 2, the digital down converter 60 comprises a multiplier 62 that receives an input signal $y_n$ (where n is an index), which in this example is a digital sequence output by the analog to digital converter 50 at a sampling rate Fs at a first input of the multiplier 62. As illustrated, a second input of the multiplier 62 receives an oscillating signal from a digital oscillator 64. The digital oscillator 64 may be arranged to produce a digital signal having a fundamental frequency set to equal a demanded frequency determined by the spectral analysis engine 70. The output of the digital oscillator 64 may be a sequence of words whose values approximate a sinusoid, and in which case a calculating engine may be provided in order to synthesize the sinusoid at an appropriate frequency. The sinusoid may be represented as a complex entity. Alternatively, a reduced resolution sinusoid may be held in read only memory, and interpolation may be used in order to synthesize an appropriate sinusoid at the appropriate frequency. In a further alternative, the output of the digital oscillator 64 could simply be a square wave such that the output of the analog-to-digital converter 50 is multiplied by 1, and then by −1 (or +a and −a), in an alternating sequence having a fundamental frequency set to an appropriate demanded frequency. This approach can be used because higher order harmonics can be rejected by a filter 66 arranged to receive the output of the mixer 62.

It will become evident from the description below that the demanded frequency can match one of the bin frequencies of the FFT engine provided as the search engine 70 at each iteration, and hence can be estimated in advance. Consequently, action may be taken to preload one or more sequences for generating the digital sinusoid into a sinusoid memory. In any event, there are several approaches known to the person skilled in the art of providing a numerically controlled (digital) oscillator.

If the digital oscillator 64 has a frequency $F_{NCO}$, then as known to the person skilled in the art, signal components are frequency shifted by $F_{NCO}$ in the down converter 60. Thus, the action of the down converter 60 is to move the frequency of the incoming signal to be centered around a new frequency. This can be exploited to implement a search of a frequency space.

As is known to the person skilled in the art, the Fast Fourier Transform (FFT) operation (and indeed many frequency analysis operations) examines an incoming signal and allocates its components to "bins." The magnitude of a signal allocated to a bin is representative of the signal strength in the frequency range belonging to the particular bin. In principle, a FFT of the incoming signal could be performed to identify the frequency of the dominant signal with a desired degree of accuracy, which can be predetermined. However, this can rapidly become computationally expensive and time consuming.

The inventor realized that a relatively simple search could be made through a frequency space to identify a range of frequencies where the dominant signal is likely to be. For example, with a 2-point Fourier transform the frequency space is divided into a top half and a bottom half. With a 3 point Fourier transform the frequency space is divided into three regions and so on. In a first iteration the first frequency range of the input signal is interrogated at a first resolution. The first resolution corresponds to a first "bin" width. Once a region containing a signal has been identified, which region can be regarded as a candidate region, then the search space (i.e., test range or search range) can be reduced to cover the frequency range of at least the candidate region and preferably is centered about the mid-frequency of that candidate region or bin. In a second iteration this reduced frequency test range is interrogated, but the number of bins used to search this reduced frequency test remains the same. Thus the bin width is reduced—or put another way the resolution is increased. The bin containing the largest signal component is identified and becomes the center of a reduced search space for the next iteration, and so on. In order to achieve this approach, a simple and robust way of defining the search space or test range at each iteration is desired. This can be achieved by the digital down converter 60 that includes a filter.

In FIG. 2, the output from the mixer 62 is passed to a narrow band filter 66 which, because of the operation of the digital down converter 60, can have a single center frequency from one iteration to the next, but whose bandwidth is variable from one iteration to the next in response to bandwidth controller 68. The narrow band filter 66 may be provided as a low pass filter or as a band pass filter. The output of the narrow band filter 66, which is a digital filter, is then provided to a decimator 69 which is operable to decimate the data stream by a controllable decimation factor D. The filter bandwidth of the narrow band filter 66 can be controlled by the bandwidth controller 68 such that it passes the entirety of the bin selected as having the maximum magnitude in the most recently performed FFT analysis. It may also be arranged to pass a guard band disposed around the bin selected for further spectral analysis.

As a result of the down converter 60, a frequency range of interest, i.e., a test range, can be down converted such that the range to be investigated in the incoming signal $Y_n$ is delivered to a known frequency space by the down converter 60. For example, the frequency range of interest could be converted such that its lowest frequency maps to a predetermined frequency in the down converter 60, such a frequency may for example be approximately 0 Hz. Alternatively, the mid-point of the frequency range may be mapped to a predetermined frequency such as the mid-point of the narrow band filter 66. In any event, the frequency of the down converter is selected such that the frequency range of the candidate region is transformed to lie within the pass band of the filter 66.

The spectral analysis engine 70 in this example comprises an N point buffer 72 which keeps a record of the most recent N words output by the decimator 69. The output from the N point buffer 72 is provided to an N point FFT engine 74 which, as known to the person skilled in the art, divides the frequency space of interest into N bins and allocates signal strengths to each of the bins. The bins are designated $Y_K$. The outputs of the N point FFT engine 74 are provided to a selector circuit 76 which, as illustrated, identifies a selected bin $Y_{K\,MAX}$ having the largest signal modulus therein. Once the selected bin $Y_{K\,MAX}$ has been identified, the center frequency of this bin can be calculated by the spectral analysis engine 70 in accordance with the search algorithm and used to set the frequency NCO of the digital oscillator 64 in a subsequent iteration. As is known to the person skilled in the art, the Fourier transform can be performed in hardware, and Analog Devices, Inc. of Norwood, Mass. has a forty-eight point FFT engine available. Therefore providing a smaller FFT engine that works, for example, on 16, 10, 8, 4, 3 or 2 points can be implemented by one of ordinary skill in the art. Therefore the specific implementation of the FFT engine need not be discussed further.

Figure 3A:
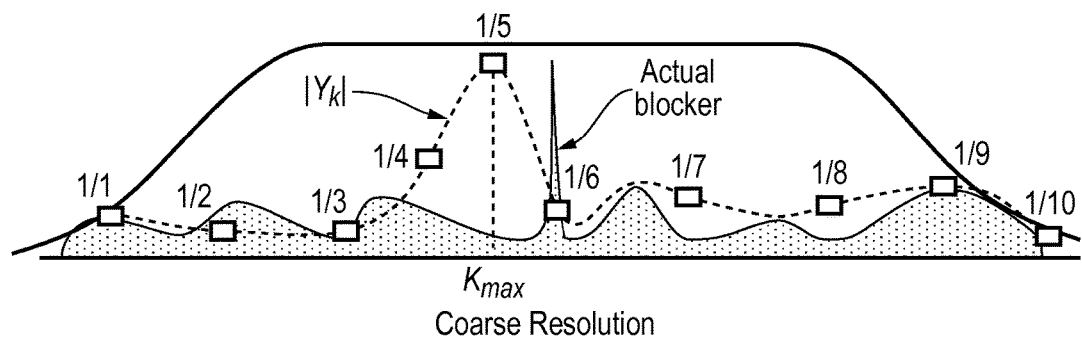
FIGS. 3a to 3c show frequency plots associated with a search process over first to third iterations.
Figure 3B:
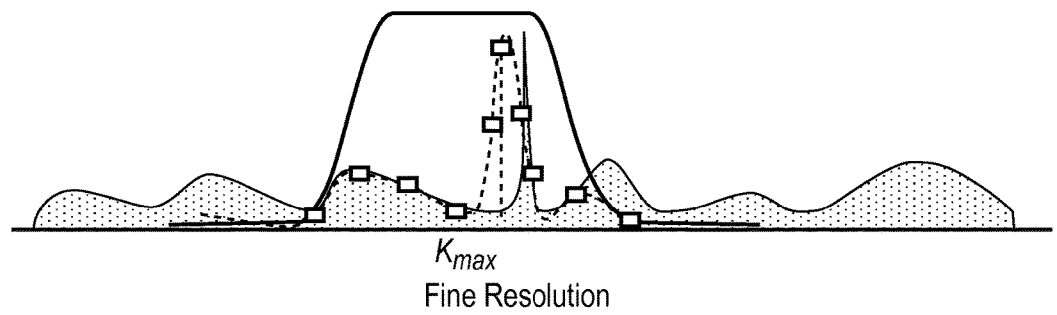
Figure 3C:
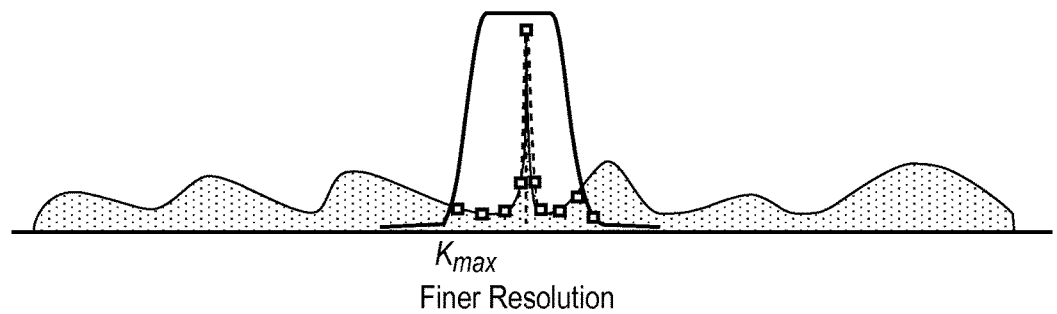

Operation of the circuit of FIGS. 1 and 2 will now be described with reference to FIGS. 3a, 3b and 3c. For convenience, 10 bins have been shown in each of these figures. It is assumed that, in a first iteration, the N point buffer is flushed, then allowed to fill with samples which have been decimated by a first decimation factor D. The first decimation factor may be unity such that every sample is passed through to the buffer until the buffer is full. Also, at the first iteration the digital oscillator 64 may not be running, and the bandwidth of the narrow band filter 66 is set to its widest bandwidth such that the entire pass band is presented to the FFT engine 74. The spectral power across the full spectrum is then allocated by the FFT engine 74 to one of a plurality of frequency bins having center frequencies $Y_1$ to $Y_{10}$ in FIG. 3a extending between a lower frequency $LF_K$ and an upper frequency $UF_K$. K is an iteration counter.

Because the illustrated frequency spectrum includes not only the most significant blocker, but other signals as well, the peak signal power ought to correspond to the bin that the blocker is in, but it could also potentially correspond to an adjacent bin. This phenomenon is known as "spectral smearing" and can manifest itself as the power of a spectral component being smeared across multiple adjacent bins. Thus in FIG. 3a, bin $Y_5$ is selected as the bin having the most signal power although in this graphical example the blocker nearly coincides with bin $Y_6$.

The frequency corresponding to frequency bin $Y_5$ in the first pass is estimated and set as the new frequency for the digital oscillator 64. This has the effect of centering the narrow band filter 66 substantially around the frequency corresponding to bin $Y_5$ of the first iteration. At this point, the bandwidth of the narrow band filter 66 may also be reduced such that it covers at least the width of bin $Y_5$ from FIG. 3a. In this example, the pass band of the filter encompasses the frequency range of bins $Y_4$, $Y_5$ and $Y_6$. The decimation factor may now be increased by a factor between 2 and N in order to increase the resolution of the FFT engine 74. This extra bandwidth can be considered as being as being a guard band. The width of the guard band may be selected by the user or the designer and could be reduced or expanded.

The decimation factor may be user or designer adjustable. Ideally, the decimation factor should be chosen to satisfy the Nyquist sampling criteria (sample rate greater than twice the maximum frequency) in order to avoid frequency aliasing.

As known to the person skilled in the art, the frequency resolution, Fres, of a fast Fourier transform is represented by Equation 1:

$$Fres = +/-0.5 \frac{F_s}{N} \quad \text{Equation 1}$$

Put another way, the frequency bin size is represented by Equation 2:

$$\frac{F_s}{N} \quad \text{Equation 2}$$

where $F_S$ is the sampling frequency, which is ideally selected to be fast enough in order to satisfy the Nyquist sampling criteria.

Because of the action of the digital down converter 60, the frequency range of interest in each successive iteration is substantially centered around direct current (DC) (0 Hz) or the center frequency of the narrow band filter 66 (at the designer's choice) and becomes narrower and narrower. Therefore the sample rate can be reduced at each iteration, and this can be done by increasing the decimation factor of the decimator 69. The resolution of the second iteration, as shown in FIG. 3b, is represented by Equation 3:

$$\text{Resolution} = +/-0.5 \frac{F_s/D}{N} \quad \text{Equation 3}$$

The bin size decreases as D increases and hence the error between the bin center frequencies and the actual blocker frequency is decreased. Once again the maximum value of each bin can be estimated to locate a new candidate bin and the digital down converter frequency can be adjusted to set the bin center frequency the mid-point of the pass band of the narrow band filter 66 and the bandwidth of this filter can be further reduced. Thus, as shown in FIG. 3c at the third iteration, an error between the actual blocker frequency and the estimated frequency of the blocker is reduced relative to the first and second iterations, and in this instance can be regarded as falling within an acceptable error value.

Figure 4:
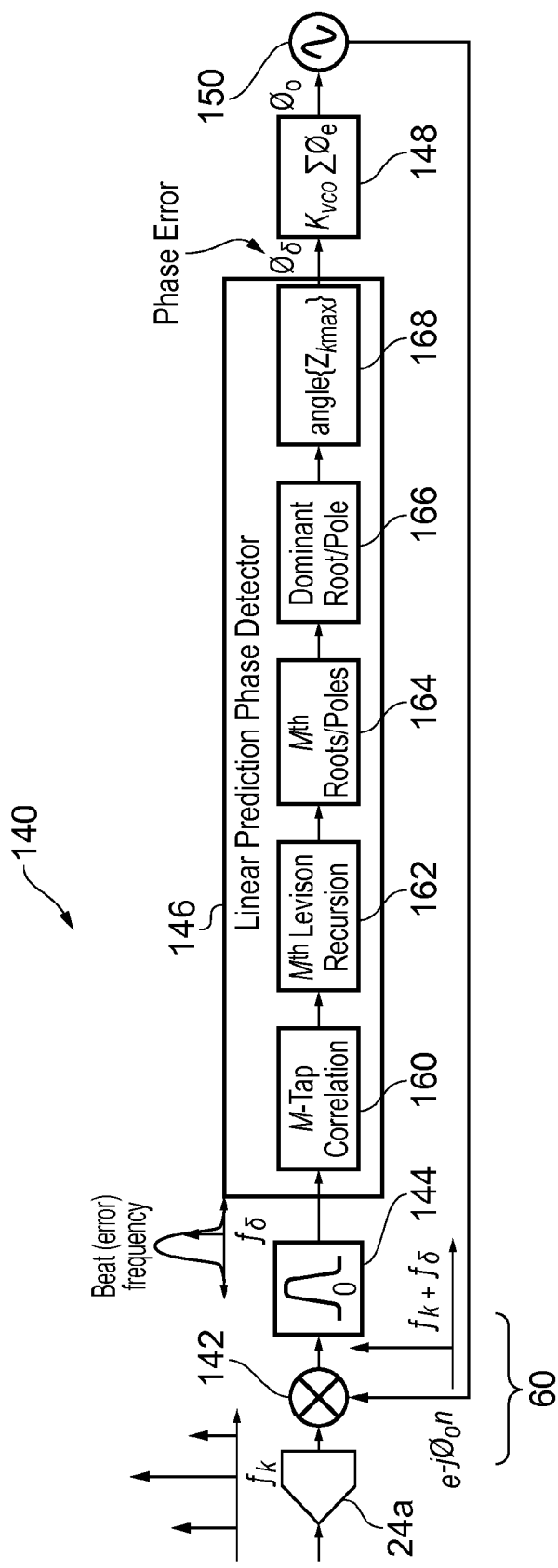
FIG. 4 is a schematic diagram of a further embodiment of an apparatus for detecting dominant and/or significant signals.

FIG. 4 schematically illustrates an embodiment of a further apparatus for identifying the frequency of a blocker signal. The apparatus receives a digitized input signal, which may be received from one of the analog to digital converters, for example analog to digital converter 24a (FIG. 2) or 50 (FIG. 1) of the receiver. The apparatus shown in FIG. 4 comprises a blocker detector 140 which, as illustrated, comprises a digital mixer 142, a digital filter 144, a parametric engine 146, a digital integrator 148, and a digitally controlled oscillator 150. The mixer 142, filter 144, integrator 148 and digital oscillator 150, may be provided as hardware components or software components that are executable by a processor, or a mixture of the two. For the purposes of the description, they will be described as if they were physical components, but it should be realized that the entirety of the features of the blocker detector 140 can be implemented by software that is executable by a processor, such as the digital baseband processor 30 of the base station shown in FIG. 7.

The parametric engine 146 may comprise several functional blocks. In the example shown in FIG. 4 the parametric engine 146 comprises an M tap correlator 160 which receives a plurality of digital words that have passed through the filter 144. The M tap correlator 160 buffers the words and performs an auto-covariance or autocorrelation function on them. The output from the M tap correlator 160 is passed to a suitable processing engine, such as an Mth order Levinson recursion engine 162 of FIG. 4, which may be implemented in a processor and which is operable, as will be described hereinafter, to output M positions of poles in a pole-zero S plane diagram or more strictly as we are dealing with a sampled data system, the position of poles in the Z plane. In FIG. 4, this data is output from an Mth poles block 164, and then examined to find the position of the dominant pole by a dominant pole block 166. The phase angle of the dominant pole can be calculated by an angle calculator 168 and output as a phase error $\varphi_e$ and provided to the integrator 148. As illustrated, the integrator 148 integrates the phase error $\varphi_e$ to obtain a phase correction signal which is provided to the digitally controlled oscillator 150 (also known as a numerically controlled oscillator) to change its frequency. The digitally controlled oscillator 150 outputs a numerical representation of a sinusoidal signal, and hence this just represents a run of numbers that represents approximations or samples of a sinusoid. This digital representation of a sinusoid can be multiplied with the digital representation of the input signal to obtain frequency mixed components as would be the case had this all been done in analog circuitry. Thus the digitally controlled oscillator 150 and the digital mixer 142 can be implemented by digital circuitry. The output of the digital mixer 142 is provided to a digital filter 144 which may be provided as a finite impulse response filter or an infinite response filter as appropriate. The digital filter 144 may have an adjustable center frequency or, as is the case in this example, may be set to have its pass band centered around a particular frequency such as 0 Hz, but to have its bandwidth controllable so as to vary the bandwidth between successive iterations of the blocker detection. Thus much of the hardware and/or software executed by a processor for this embodiment is in common with the embodiment described with respect to FIGS. 1 and 2. The operation of the parametric engine 146 will now be described, for the sake of completeness.

Given a time sequence of data, it is possible to identify the presence of potential blockers using a parametric model. Thus given a sample of N points held in a buffer, it is possible to parameterize the response of a system that has an output that approximates the sample of N points.

In fact, the response can be modelled, for example, as an auto-regressive model. An auto-regressive model views a random signal as the output of a linear time invariant system to an input which is a white noise signal. The linear time invariant system is an all pole system.

There are known powerful mathematical techniques, such as the Yule-Walker equations, that can help relate the autoregressive model parameters to the auto-covariance (or autocorrelation) of the random process. If the process has a zero mean value, then the autocorrelation and the auto-covariance are the same.

Given data Xm which represents a time sequence, it is possible to estimate the autocorrelation values for that data. Then using these values it is possible to find the linear regression parameters $\alpha_L$ for L=1 to M where M is the order of the autoregressive model.

A problem with the Yule-Walker equations is that they give no guidance on the value of M that should be used. However, as will be evident from the following discussion large M can be avoided due to computational overhead.

So, for an auto-regressive model:

$$\omega[m] = \alpha_0 x_m + \alpha_1 x_{m-1} + \alpha_2 x_{m-2} + \alpha_3 x_{m-3} \qquad \text{Equation 4}$$

$$\omega[m] = \sum_{K=0}^{M} \alpha_K x[m-k] \alpha_0 = 1 \qquad \text{Equation 5}$$

where $w[m]$ is the white noise input to the system, $\alpha$ are coefficients and $x_m$ are values of a discrete (sampled) input signal. The model in Equation 4 is for M=3, but lower order or higher order models can be constructed.

Derivation of the Yule-Walker equation is known, but is included here for completeness.

In a first operation, both sides of the equation can be multiplied by $x_{[m-L]}$, and an expectation value taken $$\sum_{k=0}^{M} \alpha_K E\{x_{m-k} x_{[m-L]}\} = E\{\omega[m] x_{[m-L]}\} \qquad \text{Equation 6}$$

The first expectation $E\{x_{[m-k]} x_m\}$ is an autocorrelation function $r_{xx}[L-K]$.

Meanwhile the expectation value of the white noise with a time shifted version of itself is zero as there is no relation between sample, and where L=0 then the expectation becomes $\sigma^2$ which is the variance of the white noise $\omega[m]$ Therefore $$\sum_{k=0}^{M} \alpha_K r_{xx}[L-K] = 0 \text{ for } L > 0 \qquad \text{Equation 7}$$

or $$\sum_{k=1}^{M} \alpha_K r_{xx}[L-K] = -r_{xx}(L) \qquad \text{Equation 8}$$

This can be expressed for various values of L. For L=1 one can write $$\begin{bmatrix} r_{xx}[0] & r_{xx}[-1] & \dots \end{bmatrix} \begin{bmatrix} \alpha_1 \\ \alpha_2 \\ \alpha_3 \\ \vdots \\ \vdots \\ \alpha_M \end{bmatrix} = -\begin{bmatrix} r_{xx}[1] \end{bmatrix} \qquad \text{Equation 9}$$

For L=2, L=3 and so on, one can write equivalent lines, so as to populate a matrix $$\begin{bmatrix} r_{xx}[0], r_{xx}[-1], r_{xx}[-2] \dots r_{xx}[1-M] \\ r_{xx}[1], r_{xx}[0], r_{xx}[-1] \dots r_{xx}[2-M] \\ \vdots \\ r_{xx}[M-1], r_{xx}[M-2], \dots r_{xx}[0] \end{bmatrix} \qquad \text{Equation 10}$$

$$\begin{bmatrix} \alpha_1 \\ \alpha_2 \\ \alpha_3 \\ \vdots \\ \vdots \\ \alpha_M \end{bmatrix} = -\begin{bmatrix} r_{xx}[1] \\ r_{xx}[2] \\ \vdots \\ r_{xx}[M] \end{bmatrix}$$

Or $$R \cdot \underline{\alpha} = \underline{r} \qquad \text{Equation 10-1}$$

Thus if we know the R values (the autocorrelation) we can solve for the coefficients $\alpha$.

Where:
R is the matrix of autocorrelation coefficients;
$\alpha$ is the vector of coefficients; and
r=vector of correlation coefficient;
so $$\alpha = -R^{-1} r \qquad \text{Equation 11}$$

There are several signal processing libraries which contain routines for quickly and robustly solving the above equations. They are available in algorithm form, and for embedding into gate or processor logic. An example of a library that is well known in the personal computing environment is MATLAB, where the function is available using the command ARYULE.

However, the user still has to decide the order of the model.

The Yule-Walker equation can be solved relatively quickly for low values of M, but the computational cost of inverting the matrix increases rapidly with increases in M. This can be seen by comparing the complexity of inverting a 2×2 matrix and a 3×3 matrix using techniques such as elementary row operations (which is intuitive rather than formulaic) or using the technique of calculating minors, cofactors and adjugate (or adjoint) matrix, which is a deterministic four operation process (calculate matrix and minors, turn that into a matrix of cofactors, then form the adjoint matrix, and multiply by 1/determinant).

Numerical methods exist, but the computational overhead increases significantly with the order.

The Levinson algorithm can be used to solve the Yule-Walker equations recursively. The Levinson algorithm is an example of an algorithm that can efficiently extract the coefficients for an autoregressive model. The Levinson algorithm is also available in library form so can be used without an understanding of its derivation. However a brief derivation is included here as it can be instructive.

A prediction error $\varepsilon_m$ can be defined where m is an index representing the order of the Yule-Walker equations.

For m=0, the Yule-Walker equations give $$\varepsilon_0 = r_{xx}(0) \qquad \text{Equation 12}$$

Simply there is no filter or system acting on the white noise.

For order m=1, we can return to the derivation of the Yule-Walker equations, which give $$r_{xx}[0]\alpha_1 = r_{xx}[1] \qquad \text{Equation 13}$$

so $$\alpha_1 = \frac{r_{xx}[1]}{r_{xx}[0]} \qquad \text{Equation 14}$$

and $$\varepsilon_1 = r_{xx}[0] + \alpha_1 r_{xx}[1] \qquad \text{Equation 15}$$

In general, the Levinson (or more properly the Levinson-Durbin) algorithm can solve the Yule-Walker equations of order m by exploiting the solution to the Toeplitz matrix of order m−1.

The matrix R is in the form of a Toeplitz matrix, which is often written as $$T^m = \begin{bmatrix} t_0 & t_{-1} & t_{-2} & t_{-3} & \cdots & t_{-m+1} \\ t_1 & t_0 & t_{-1} & & \cdots & t_{-n+2} \\ t_2 & t_1 & t_0 & & & \\ \vdots & & & & & \\ t_{m-1} & & & & & t_0 \end{bmatrix} \qquad \text{Equation 16}$$

The Levinson-Durbin algorithm proceeds, in a first operation, to form "forward" and "backward" vectors.

A forward vector $\vec{f}^m$ is a vector of length m that satisfies the condition $$T^m \vec{f}^m = \hat{e}i \qquad \text{Equation 17}$$

Where $\hat{e}i$ is a vector which is populated by zeros, except for the ith place which has a value of one.

Similarly a backward vector $\vec{b}^m$ is a vector of length m which satisfies $$T^m \vec{b}^m = \hat{e}_m \qquad \text{Equation 18}$$

One can extend the matrix and vectors by adding rows and columns (as appropriate) such that $$T^m \begin{bmatrix} \vec{f}_{m-1} \\ 0 \end{bmatrix} = \begin{bmatrix} T^{m-1} & t_{m+1} \\ & \\ t_{-m-1}, t_{-m-2} & t_0 \end{bmatrix} \begin{bmatrix} \vec{f}^{m-1} \\ 0 \end{bmatrix} = \begin{bmatrix} 1 \\ 0 \\ 0 \\ 0 \\ \varepsilon_f^m \end{bmatrix} \qquad \text{Equation 19}$$

In extending the matrix, the extra column added to the matrix does not alter or perturb the solution when a zero is used to extend the forward vector. The same does not apply to the extra row, which does perturb the solution and creates a forward error $\varepsilon_f$ for the nth power, hence use of the notation $\varepsilon_f^m$.

The backward vector can be similarly extended $$T^m \begin{bmatrix} 0 \\ \vec{b}_{m-1} \end{bmatrix} = \begin{bmatrix} T_0 & \cdots & t_{-m+2} & t_{-m+1} \\ \vdots & & & \\ & & T^{m-1} & \\ \vdots & & & \\ t_{m-1}, t_{m-2} & t_0 \end{bmatrix} \begin{bmatrix} 0 \\ \vec{b}^{m-1} \end{bmatrix} = \begin{bmatrix} \varepsilon_b^m \\ 0 \\ 0 \\ \vdots \\ 0 \\ 1 \end{bmatrix} \qquad \text{Equation 20}$$

And it also gives rise to an error term.

The error terms can be used to substantially cancel each other $$T\left(\alpha\begin{bmatrix} \vec{f} \\ 0 \end{bmatrix} + \beta\begin{bmatrix} 0 \\ \vec{b} \end{bmatrix}\right) = \alpha\begin{bmatrix} 1 \\ 0 \\ 0 \\ 0 \\ 0 \\ \vdots \\ \varepsilon_f \end{bmatrix} + \beta\begin{bmatrix} \varepsilon_b \\ 0 \\ 0 \\ 0 \\ 0 \\ \vdots \\ 1 \end{bmatrix} \qquad \text{Equation 21}$$

With some manipulation, it is known that $$\vec{f}_m = \alpha_f^m \begin{bmatrix} \vec{f}_{m-1} \\ 0 \end{bmatrix} + \beta_f^m \begin{bmatrix} 0 \\ \vec{b}_{m-1} \end{bmatrix} \qquad \text{Equation 22}$$

And $$\vec{b}_m = \alpha_b^m \begin{bmatrix} \vec{f}_{m-1} \\ 0 \end{bmatrix} + \beta_b^m \begin{bmatrix} 0 \\ \vec{b}_{m-1} \end{bmatrix} \qquad \text{Equation 23}$$

These equations can be manipulated to derive $$\begin{bmatrix} 1 & \varepsilon_b^m \\ 0 & 0 \\ 0 & 0 \\ \vdots & \vdots \\ \varepsilon_f^m & 1 \end{bmatrix} \begin{bmatrix} \alpha_f^m & \alpha_b^m \\ \beta_f^m & \beta_b^m \end{bmatrix} = \begin{bmatrix} 1 & 0 \\ 0 & 0 \\ \vdots & \vdots \\ 0 & 1 \end{bmatrix} \quad \text{Equation 24}$$

The zero's in the middle do not contribute so this can be collapsed to $$\begin{bmatrix} 1 & \varepsilon_b^m \\ \varepsilon_f^m & 1 \end{bmatrix} \begin{bmatrix} \alpha_f^m & \alpha_b^m \\ \beta_f^m & \beta_b^m \end{bmatrix} = \begin{bmatrix} 1 & 0 \\ 0 & 1 \end{bmatrix} \quad \text{Equation 25}$$

and solved, for example using the Cramer 2×2 inverse matrix formula.

The process is quick for low orders of m.

Other numerical techniques or algorithms may also be used, such as the Bareiss algorithm, Schur decomposition and Cholesky decomposition. Other techniques also exist.

In the context of a telecommunications system, as noted above, a signal to be received may be in the presence of many signals which may interfere with the reception of a wanted signal. These other signals are often known as interfering signals, interferers, blocking signals or blockers, and as noted before it would be advantageous to know of the presence of blockers such that actions can be taken to mitigate its effect or their effects.

It might be supposed that providing a sequence of received symbols/data to a parametric engine, such as an autoregressive model, would enable the amplitude and frequency of each potential blocker to be determined.

However, the inventor realized that this assumption is unfounded, due to significant computational cost of such a process.

As noted above, the computational cost with allowing a large order M within the parametric engine increases rapidly due to the operation of inverting successively large matrices. However, the inventor realized that the performance of an underspecified (low M) parametric engine could be exploited to provide computationally simple system for identifying the poles in a parametric representation of the input data stream.

The inventor observed that if an parametric engine is constrained to have a low order, for example an order of one or two, but is asked to parameterize a system having three or more poles, then the engine tends to place its estimates of the pole position near the positions of the largest pole or poles in the input signal. Thus, although the result is not strictly correct, it is a reasonable approximation to the final result. This can be exploited to narrow down the frequency search space, (i.e. a test range) in a subsequent iteration by bandwidth limiting the input signal so that it excludes the less significant poles but includes the more significant poles. This allows the matrix inversion or other computational cost to be significantly reduced. However it is also desirable that the complexity and cost of the filter is also simplified where possible. This tends to indicate using a filter using a relatively simple band pass characteristic. Taking both these features into consideration the inventor realized that suitable performance could be achieved with a low order parametric engine, such as a single order parametric engine operated in an iterative or recursive manner to search smaller frequency spaces centered around the estimated pole frequency from a preceding iteration.

Figure 5:
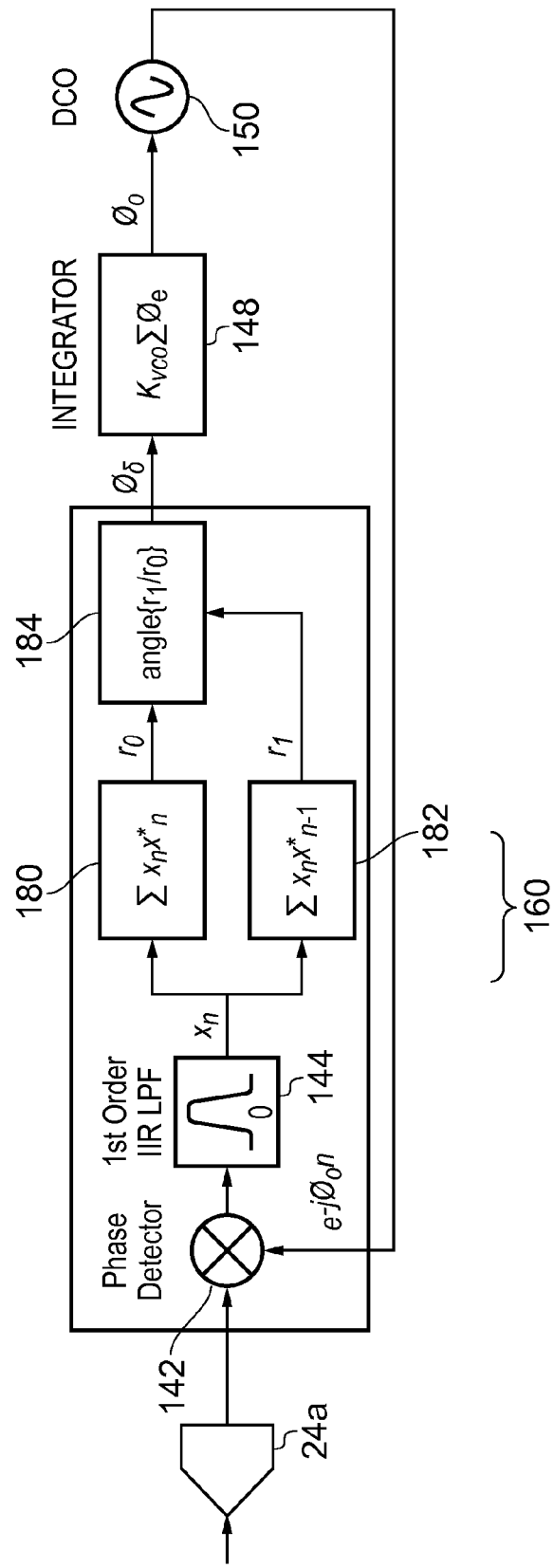
FIG. 5 shows a variation on the apparatus shown in FIG. 4.

Parametric engines of low order but having an order greater than one can also be implemented relatively easily. An example of a single order parametric engine is shown in FIG. 5 where parts which have been described with respect to FIG. 4 are given like reference numerals. The correlator 160 has a first portion 180 arranged to form a complex autocorrelation $x_n x_n^*$ and a second portion 182 arranged to form the autocorrelation between the n and the conjugate of a succeeding sample n−1, expressed as $x_n x_{n-1}^*$. The outputs are designated $r_0$ and $r_1$ of the first portion 180 and the second portion 182, respectively, are provided to an angle determining unit 184, which can compare the ratio of $r_1$ to $r_0$ to determine an angular displacement on the phasor diagram represented by $\varphi_e$, which as described hereinbefore is provided to the integrator 148 that controls the digitally controlled oscillator 150. The circuit in FIG. 5 is a single order (M=1) engine implementing equation 14. This is computationally simple.

Figure 6:
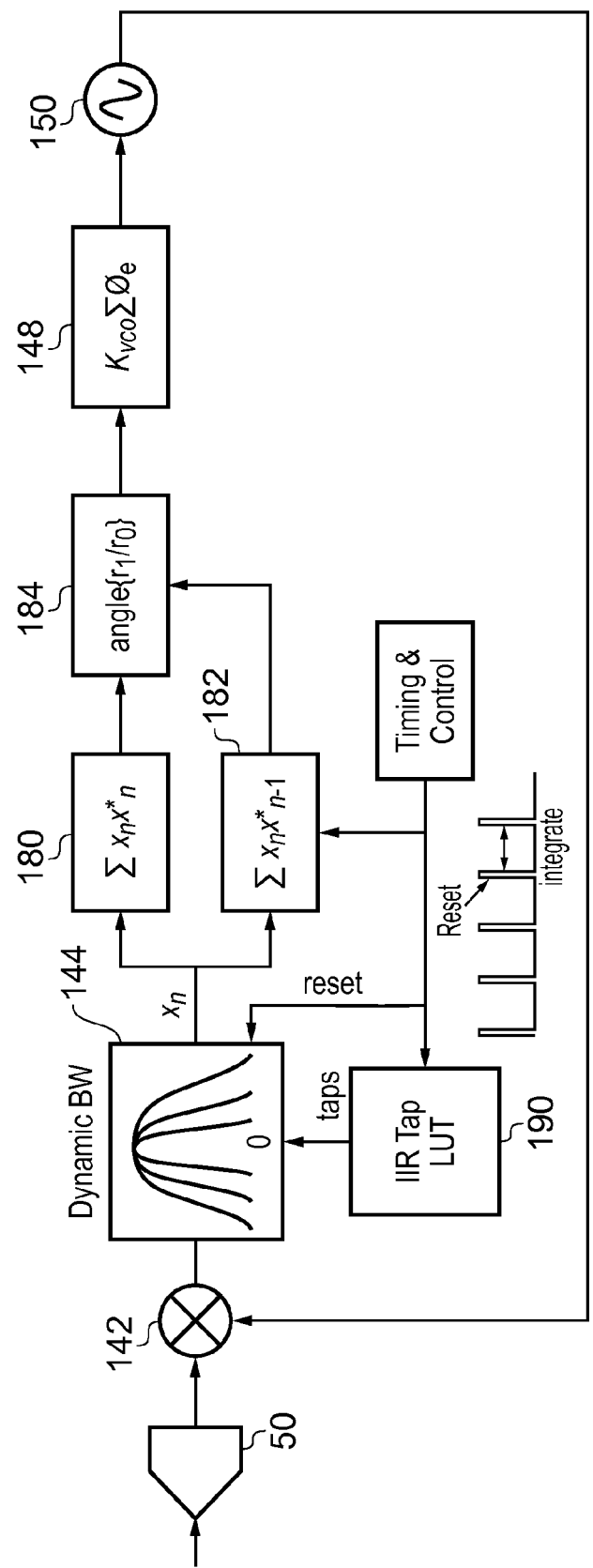
FIG. 6 shows portions of the apparatus of FIG. 5 in more detail.

The circuit of FIG. 5 is repeated in FIG. 6, together with a graphical representation of the timing and reset signals provided to the correlation blocks 180 and 182, and also to a filter tap lookup table 190 which is used to address and change the tap coefficients between successive iterations of the circuit in order to progressively reduce the pass band of the filter 144 until such time as the position of the potential interfering signal is estimated with sufficient accuracy. Thus the circuit shown in FIG. 6 operates to iteratively estimate the frequency of the blocker, and then use the down converter/frequency translator and filter to zoom in on the blocker and to estimate its frequency to a greater accuracy.

As noted before, single order engines are relatively easy to implement but the present disclosure in not limited to the use of first order parametric engines.

Figure 8:
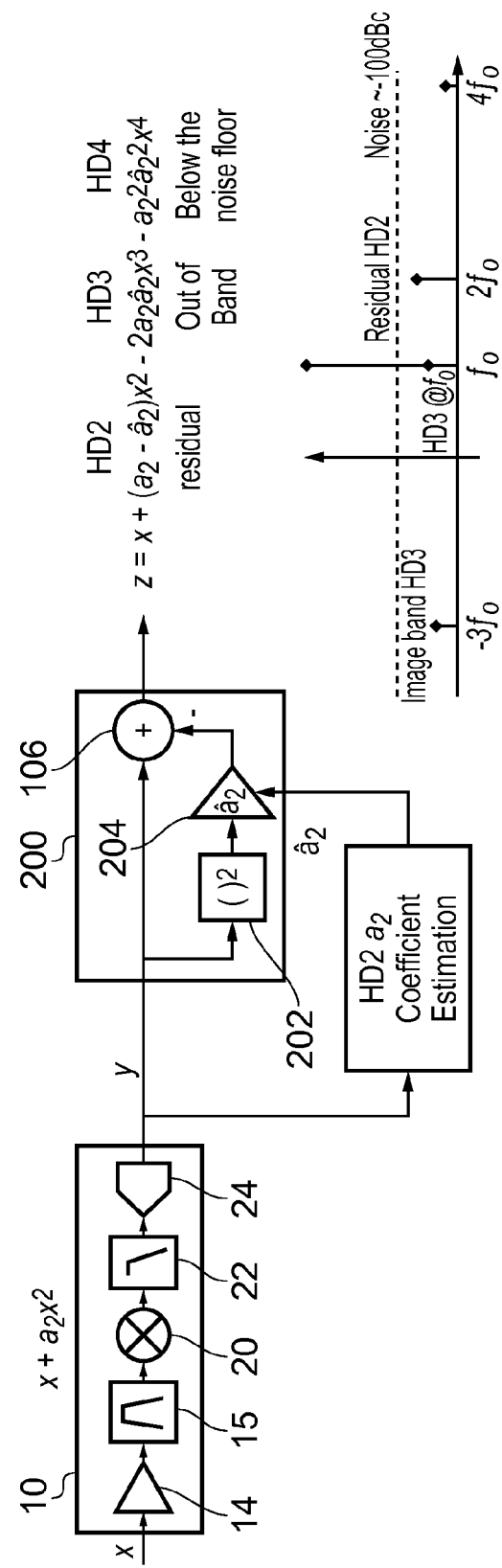
FIG. 8 shows the use of signal processing apparatus to reduce harmonic distortion within a radio receiver, which in this example is provided at a base station of a mobile data and telephony system.

FIG. 8 shows a schematic representation of a radio receiver 10 in communication with a second harmonic reducer 200. The radio receiver 10 is similar to that described with respect to FIG. 7. The radio receiver 10 may comprise a low noise amplifier 14 to amplify a received signal. The signal may then be passed through a bandwidth limiting filter 15 before being provided to a mixer 20 that mixes the signal with a local oscillator signal (not shown) to convert the incoming RF signal of interest to Baseband or to a low intermediate frequency that is then filtered by the low pass filter 22 and digitized by analog to digital converter 24 (or 50 in FIG. 1). This process should be linear, but small gain errors may exist and can for example be modelled by power terms. In order to remove these non-linearities which typically manifest themselves by the generation of harmonic signals, the second harmonic reducer 200 comprising a squarer 202, a correction signal generator 204 and an adder 206 is provided in FIG. 8. Given that the second harmonic reducer 200 acts (in this example) on the digitized output of the ADC 24, then the squarer 202 can be implemented in hardware as a two input digital multiplier. The output of the squarer 202 is provided to the correction signal generator which receives an estimated correction coefficient $\hat{a}_2$. The sign of $\vec{a}_2$ can be negated such that adding the output of the multiplier 104 to the corresponding digital word from the ADC 24 at adder 206 forms a further output $$Z = x + (a_2 - \hat{a}_2)x^2 \quad \text{Equation 26}$$

Further analysis would show a third harmonic $HD3 = -a_2 \hat{a}_2 x^3$ out of the pass band and a fourth order harmonic $HD4 = -a^2{}_2 \hat{a}^2{}_2 x^4$ below the noise floor of the receiver.

The residual amount of the second harmonic depends on the accuracy of estimation of $\hat{a}_2$ to reduce $a_2 - \hat{a}_2$.

Figure 9:
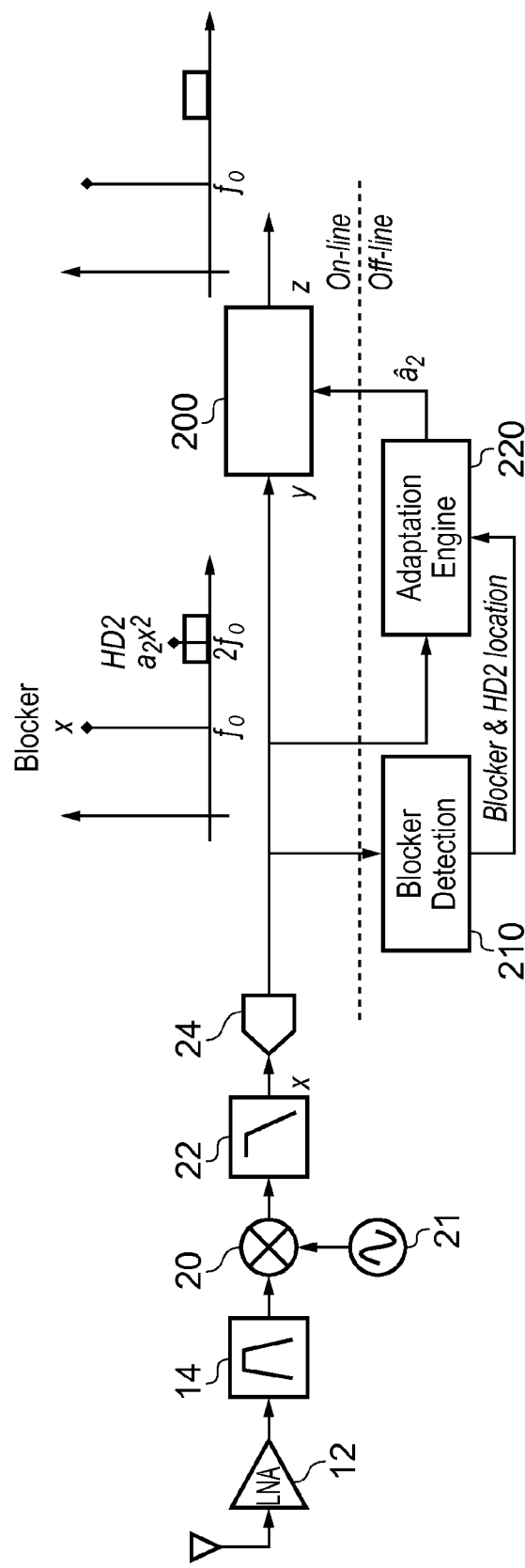
FIG. 9 shows the role of the dominant signal detector within the harmonic distortion reducer.

FIG. 9 is a block diagram of a second harmonic reduction circuit in association with a radio receiver, as might be found in a mobile receiver or a base station. The reducer 200, which can be as described in connection with FIG. 8, is associated with a blocker detection engine 210 as described with respect to FIG. 1 to 3c or 4 to 6. The blocker detection engine 210 is connected to an adaptation engine 220, which may be implemented in hardware, software executed by a processor, or a mixture of the two.

The reducer 200 runs continuously while the ADC 24 is outputting data, whilst the blocker detection engine 210 and the adaptation engine 220 can be run intermittently.

The correction signal generator 204 (FIG. 8) may be implemented as a buffer or delay line for maintaining a record of the most recent N output words from the ADC 24 (or 50 in FIG. 1). The second harmonic reduction circuit works on the in-phase and quadrature signals. Many responses or transfer characteristics may be implemented in the reduction circuit which is analogous in its construction to a finite impulse response (FIR) filter comprising R delay elements. The adaptation engine 220 is arranged to use the output of blocker detector 210 to adapt the operation of filters used to filter the input signals that it receives, one input being the signal supplied to the harmonic reducer 200 and the other input being the output of the harmonic reducer 200, and to select from these signals the blocker signal and to seek to adjust the coefficients of the correction signal generator to minimize the influence of the blocker signal.

Figure 10:
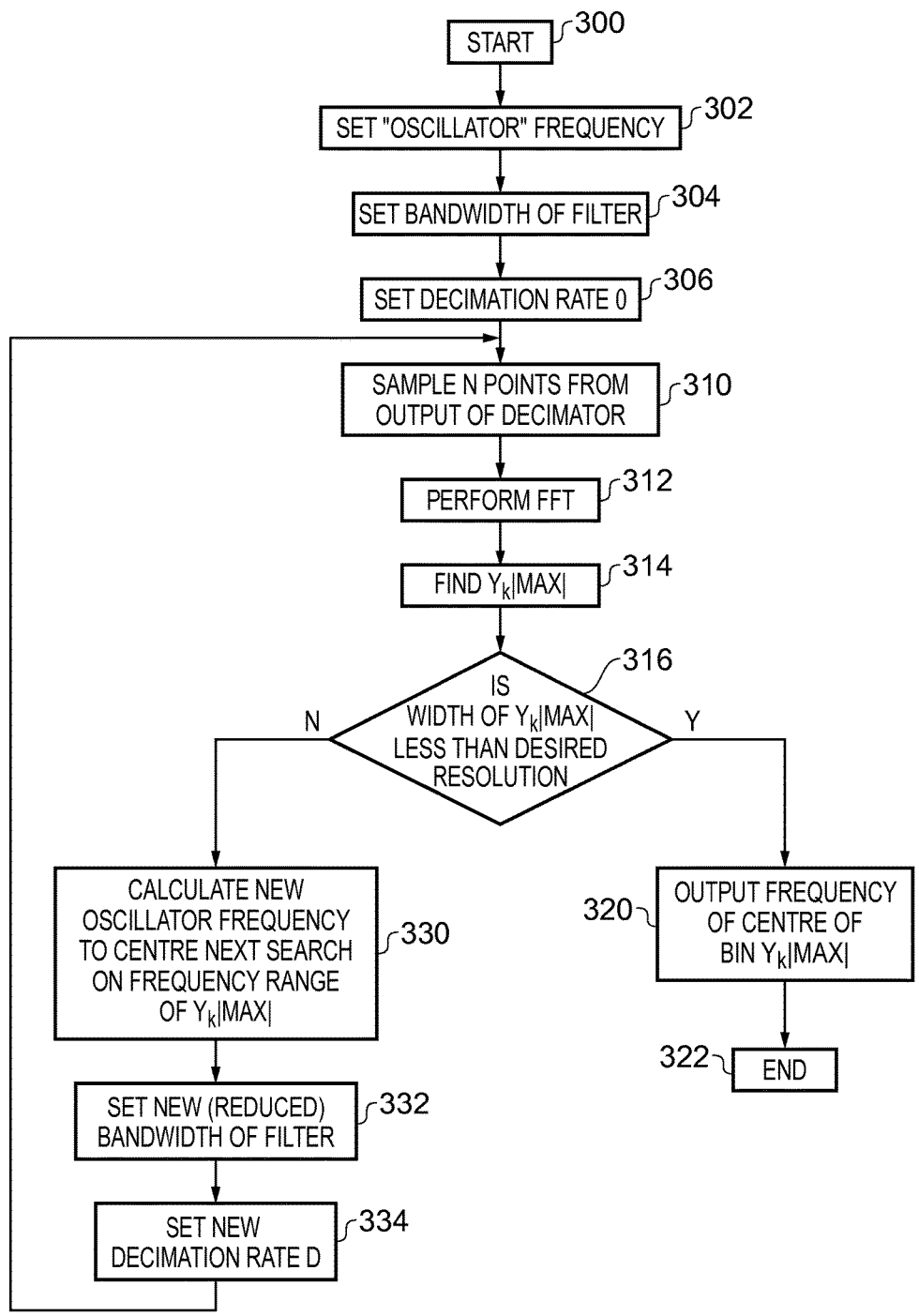
FIG. 10 is a flow chart of a search process in accordance with an embodiment of this disclosure.

FIG. 10 is a flow chart of a search algorithm constituting an embodiment of the present disclosure for use with, for example, the apparatus shown in FIGS. 1 and 2. The search process starts at block 300. Control is then passed to operation 302 where an initial oscillator frequency is set. This may include not setting the oscillator running, such that no frequency translation is performed at the first pass. Control is then passed to operation 304 when the bandwidth of the filter 66 is set to an initial value. The filter may be set to its maximum bandwidth or to a bandwidth commensurate with the frequency range that is to be investigated. Control is then passed to operation 306 where an initial decimation rate D is set. The initial decimation rate may include not performing any decimation at all, such that each sample from the analog to digital converter 50 is passed to the output of the decimator 69.

Control is then passed to operation 310 where N samples from the output of the decimator are captured in the N-point buffer 72. Once this has been completed, control is passed to operation 312 where the FFT engine 74 performs its conversion. Control is then passed to operation 314 where the output of the FFT engine 74 is examined to find the FFT bin having the greatest magnitude (as indicated by circuit element 76 in FIG. 2). Control is then passed to operation 316 where a decision is made as to whether the width of the FFT bins has been decreased to an extent such that any results output by the FFT engine have a desired resolution. If this has been achieved control is passed to step 320 where the FFT detection algorithm 70 of FIG. 2 outputs a frequency corresponding to the center frequency of the selected bin $Y_K|\text{max}|$. Control than passes to operation 322 which represents the end of the algorithm.

Returning to operation 316, if the width of the bins is greater than desired resolution, then control is then passed to operation 330. Operation 330 calculates a new oscillator frequency so as to center the frequency search about the central frequency of the selected bin $Y_K|\text{max}|$, and sets this frequency in the oscillator 64. Control is then passed to operation 332 where a new and reduced bandwidth of the filter 66 is calculated and set. Control is then passed to operation 334 where a new decimation rate D is set such that the resolution of the FFT engine is increased. Having performed these steps, control is returned to operation 310.

It is thus possible to provide an apparatus that is able to identify a blocker harmonic, and which does not use large FFT engines. Thus, a complex computation can be replaced by several much simpler computations. This allows the buffer size of incoming data to be reduced. The requirement for a relatively large buffer is replaced by repeatedly capturing data into smaller buffers (or into the same buffer in a sequential manner). This allows for savings in the hardware or software overhead to implement a FFT engine and also in the hardware used to provide the buffer.

Similarly, the parametric engine can be used to search through the input frequency range to find the frequency of the blocker, and to pass this to the reduction circuit. The search can be similar to that described with respect to FIG. 10.

Figure 11B:
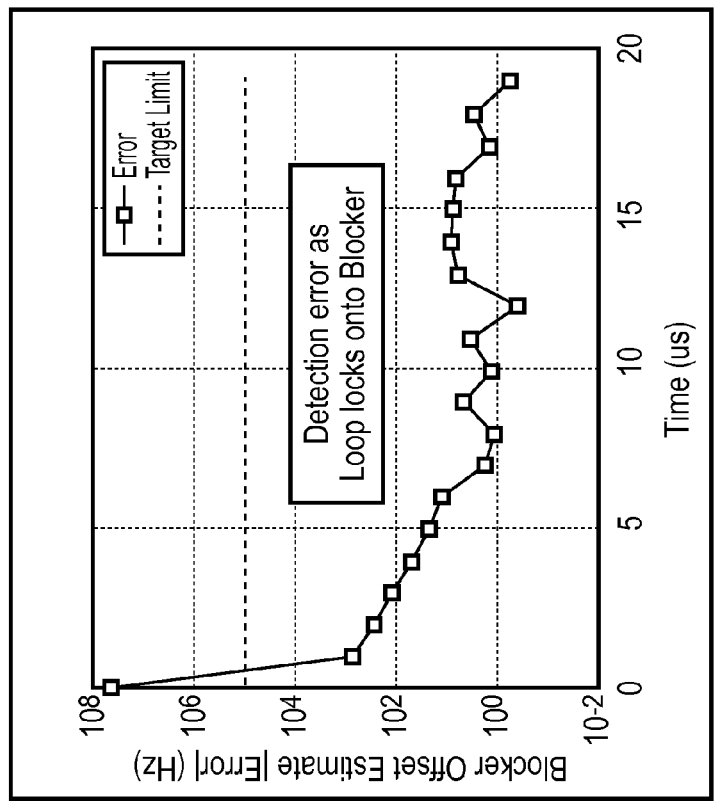
FIGS. 11a and 11b are plots that illustrate the performance of the parametric engine in response to the presence of a single blocker signal.
Figure 11A:
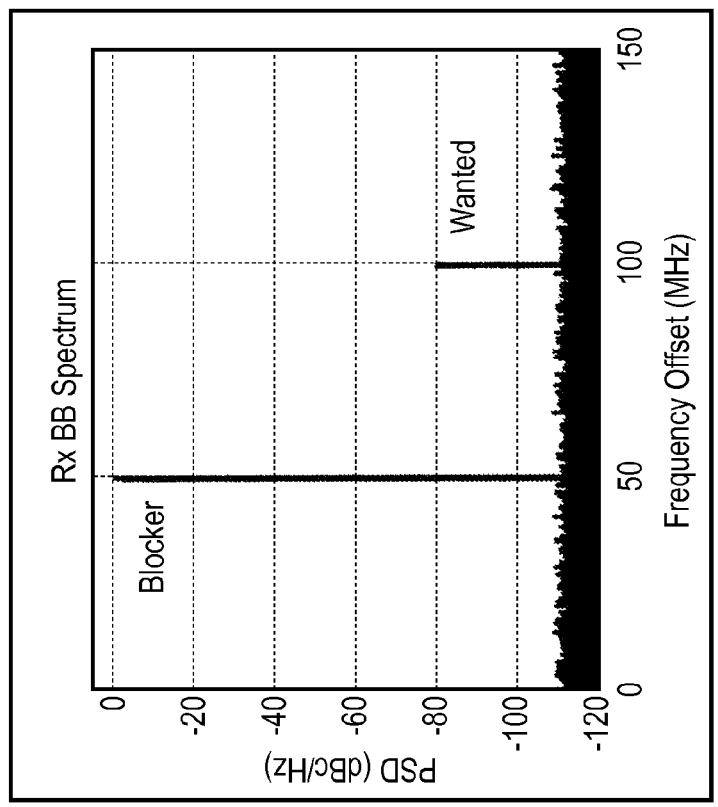

FIGS. 11a and 11b show measured performance for the parametric engine shown in FIG. 4. In the test illustrated with respect to FIGS. 11a and 11b the wanted signal had a power level of −80 dB compared to the blocker signal. The blocker occurred (was centered about) at 50 MHz in the down converted signal whereas the wanted frequency occurred at 100 MHz in the down converted signal. Consequently non-linearity in the receiver could cause an image of the blocker to sit over the wanted signal. In testing the parametric engine locked to the blocker within 2 microseconds and rapidly achieved as estimate of frequency to within tens of Hertz.

Figure 12B:
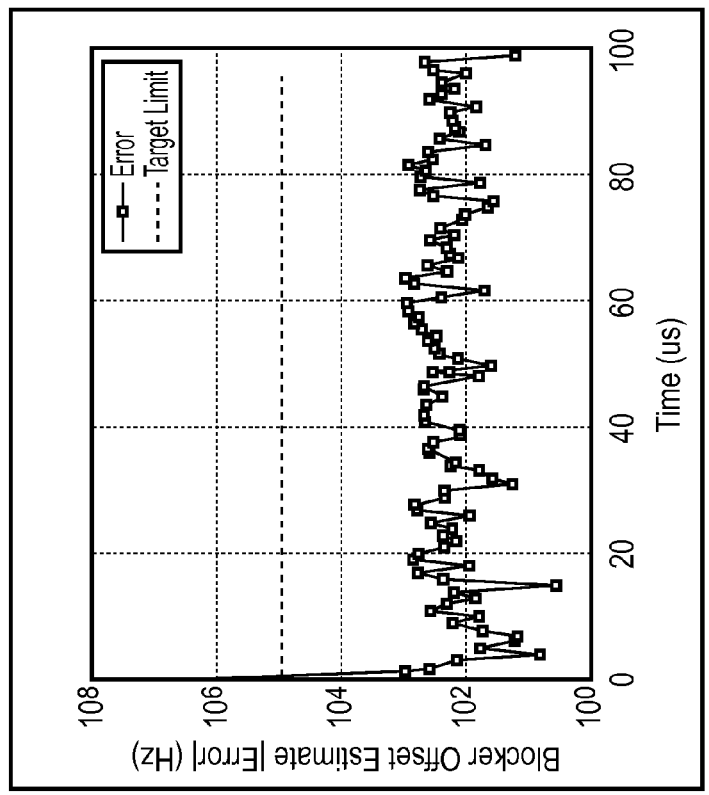
FIGS. 12a and 12b are plots that illustrate the performance of the parametric engine in identifying a blocker in a spectrum having a plurality of potential blocker signals.
Figure 12A:
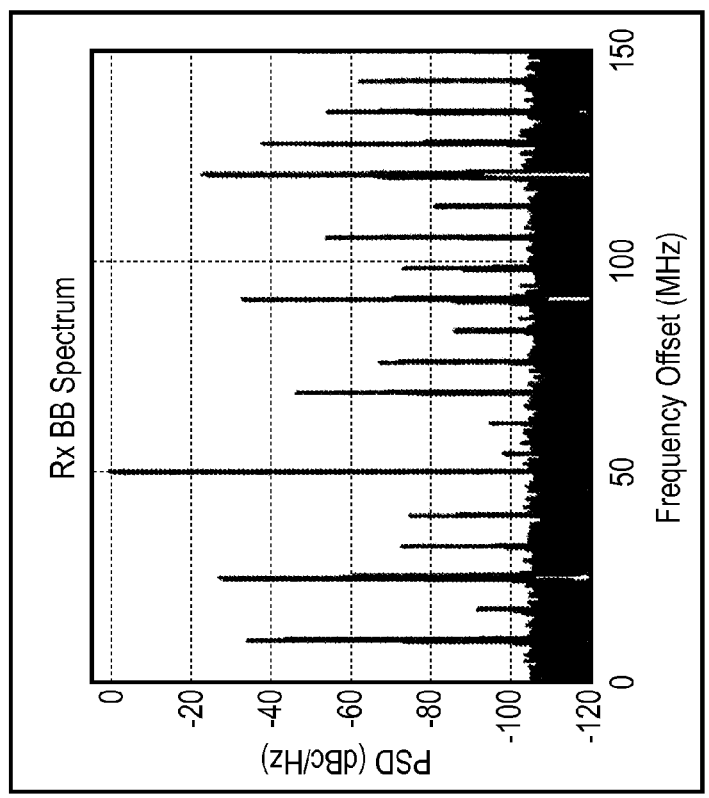

A similar test is shown in FIGS. 12a and 12b, but here multiple potential blockers are present, although there is only one dominant or primary blocker. The engine still performs well and correctly locates the dominant or primary blocker, with an acceptable blocker frequency estimate within 1 or 2 microseconds and a frequency error of only a few hundred Hertz.

The engines described here can be operated in a successive approximation (search and zoom) mode as described herein. However they can also be arranged to scan across the input signal range in a stepwise manner. Any bin of frequencies having a potentially significant or dominant signal where the power exceeds a threshold of significance can then be investigated further.

Such an arrangement may be provided in hardware, software of a mixed system and is suitable for inclusion in communications, control and other systems and applications.

The principles and advantages described herein can be implemented in various apparatus. Examples of such apparatus can include, but are not limited to, consumer electronic products, parts of the consumer electronic products, electronic test equipment, wireless communications infrastructure such as a cellular base station, etc. Consumer electronic products can include, but are not limited to, wireless devices, a mobile phone (for example, a smart phone), a telephone, a television, a computer, a hand-held computer, a wearable computer, a tablet computer, a laptop computer, a watch, etc. Further, apparatuses can include unfinished products. The disclosed techniques are not applicable to mental steps, and are not performed within the human mind or by a human writing on a piece of paper.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments have been described, these embodiments have been presented by way of example only, and are not intended to limit the scope of the disclosure. Indeed, the novel methods, systems, and apparatus described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The claims presented here are in single dependency format suitable for use with the USPTO. However it is to be understood that any claim can depend on any preceding claim of the same type except where that is clearly technically infeasible.

What is claimed is:

1. An electronically-implemented method of analyzing a signal in a blocker detector to locate at least one comparatively significant interfering frequency component therein, the blocker detector configured to receive the signal from an analog-to-digital converter of a radio receiver, the method comprising:
   analyzing, using electronic hardware of the blocker detector, a test range of frequencies of the signal received from the analog-to-digital converter of the radio receiver to identify a subrange of the test range that includes a potentially significant interfering component within the test range, wherein the subrange is smaller than the test range; and
   iteratively performing the analyzing on the subrange identified in the previous analyzing until a condition for finishing the analysis has been met, wherein the blocker detector is configured to determine whether the condition has been met;
   wherein the iteratively performing the analyzing comprises using a Fast Fourier Transform engine to divide the subrange identified in the previous analyzing using the Fast Fourier Transform engine into bins and to identify the subrange based on a bin of the bins having the greatest magnitude.

2. A method as claimed in claim 1, further comprising reducing a bandwidth of a filter of a digital down converter of the blocker detector in between iterations of performing the analyzing on the subrange identified in the previous analyzing.

3. A method as claimed in claim 2, further comprising modifying a frequency of a signal provided by an oscillator to a mixer of the digital down converter between the iterations.

4. A method as claimed in claim 1, further comprising determining, by the blocker detector, whether the condition for finishing the analysis has been by at least one of:
   determining that one or more frequency components have been identified to a predetermined accuracy; or
   determining that an iteration limit has been reached.

5. A method as claimed in claim 1, further comprising generating a cancellation signal for reducing an influence of the significant interfering frequency component after the condition has been met.

6. A method as claimed in claim 1, further comprising, prior to the analyzing, filtering an input signal to exclude or attenuate frequency components outside of the test range.

7. A method as claimed in claim 6, further comprising frequency translating the signal provided by the analog-to-digital converter such that the filtering operates over overlapping frequency ranges at each iteration of said analyzing.

8. A method as claimed in claim 7, in which a bandwidth of the filtering is reduced at each iteration.

9. A method as claimed in claim 1, in which the Fast Fourier Transform engine works on N samples, where N is an integer less than or equal to 16.

10. A method as claimed in claim 1, in which the Fast Fourier Transform works on N samples, where N is an integer less than or equal to 4.

11. A method as claimed in claim 1, further including decimating the signal provided to the Fast Fourier Transform engine by a decimation factor that is increased at each iteration.

12. A method as claimed in claim 1, wherein each iteration of the analyzing comprises dividing the test range of frequencies into a same number of bins.

13. A dominant signal detection apparatus comprising:
   a digital frequency translator comprising circuitry configured to receive an input signal and to output a digital signal that is frequency translated relative to the input signal; and
   a spectral analysis engine comprising circuitry configured to identify a subrange of a frequency of the digital signal, the subrange including a dominant signal,
   wherein the digital frequency translator and the spectral analysis engine are together arranged to recursively search an input frequency range of the input signal, and at each iteration of the recursive search to search a reduced frequency search range identified in a previous iteration of the recursive search as including the dominant signal, and to continue the recursive search until a frequency of the dominant signal has been estimated to a predetermined accuracy, wherein the spectral analysis engine comprises a Fast Fourier Transform engine configured to divide the subrange identified in the previous iteration using the Fast Fourier Transform engine into bins and to identify the subrange based on a bin of the bins having the greatest magnitude.

14. An apparatus as claimed in claim 13, in which the digital frequency translator is a digital down converter.

15. An apparatus as claimed in claim 13, in which the digital frequency translator comprises a mixer and a filter, and the apparatus is arranged to reduce a bandwidth of the filter at each pass.

16. An apparatus as claimed in claim 15, in which a digitally controlled oscillator is arranged to adjust a frequency of a signal provided to the mixer at each pass.

17. An apparatus as claimed in claim 13, in which the Fast Fourier Transform engine is an N-point Fast Fourier Transform engine, wherein N is a positive integer less than or equal to 8.

18. A radio receiver comprising a dominant signal detection apparatus as claimed in claim 13, and wherein the dominant signal detection apparatus is arranged to determine a harmonic of a blocker signal.

19. A radio receiver as claimed in claim 18, further comprising a correction signal generator in communication with the dominant signal detection apparatus, the correction signal generator arranged to reduce an influence of the dominant signal on the input signal.

20. An apparatus as claimed in claim 13, in which the Fast Fourier transform engine is configured to estimate a same number of bins in the reduced frequency range in each iteration of the recursive search.

21. A dominant signal detection apparatus comprising:
a frequency translator comprising circuitry configured to receive an input signal and to provide an output signal that is frequency translated relative to the input signal; and
a spectral analysis engine comprising circuitry configured to identify a subrange of a frequency of the output signal, the subrange including a dominant signal, wherein the circuitry of the spectral analysis engine comprises a Fast Fourier Transform engine,
wherein the frequency translator and the spectral analysis engine are together arranged to recursively search an input frequency range of the input signal, and to search a reduced frequency search range identified in a previous iteration of the recursive search as including the dominant signal at each iteration of the recursive search, and to continue the recursive search until a frequency of the dominant signal has been estimated to a predetermined accuracy, and
wherein the Fast Fourier transform engine is configured to divide the reduced frequency range into the same number of bins in each iteration of the recursive search.

22. A dominant signal detection apparatus as claimed in claim 21, further comprising an analog-to-digital converter configured to provide the input signal to the frequency translator.

23. A dominant signal detection apparatus as claimed in claim 21, wherein the Fast Fourier Transform engine is an N-point Fast Fourier Transform engine, and wherein N is a positive integer that is less than or equal to 16.

24. A dominant signal detection apparatus as claimed in claim 21, wherein the spectral analysis engine is configured to identify the subrange based on a bin of the bins having the greatest magnitude.

25. An electronically-implemented method of analyzing a signal in a blocker detector to locate at least one comparatively significant interfering frequency component therein, the blocker detector configured to receive the signal from an analog-to-digital converter of a radio receiver, the method comprising:
analyzing, using electronic hardware of the blocker detector, a test range of frequencies of the signal received from the analog-to-digital converter of the radio receiver to identify a subrange of the test range that includes a potentially significant interfering component within the test range, wherein the subrange is smaller than the test range; and
iteratively performing the analyzing on the subrange identified in the previous analyzing until a condition for finishing the analysis has been met, wherein the blocker detector is configured to determine whether the condition has been met;
wherein the iteratively performing the analyzing comprises using a parametric engine to determine a dominant pole in the subrange identified in the previous analyzing and to identify the subrange based on the dominant pole.

26. A method as claimed in claim 25, in which the the parametric engine is a low order or a single order parametric engine.

27. A method as claimed in claim 25, wherein each iteration of the analyzing comprises estimating a same number of poles in the test range.

28. A method as claimed in claim 25, further comprising reducing a bandwidth of a filter of a digital down converter of the blocker detector in between iterations of performing the analyzing on the subrange identified in the previous analyzing.

29. A method as claimed in claim 25, further comprising generating a cancelation signal for reducing an influence of the significant interfering frequency component after the condition has been met.

30. A dominant signal detection apparatus comprising:
a digital frequency translator comprising circuitry configured to receive an input signal and to output a digital signal that is frequency translated relative to the input signal; and
a spectral analysis engine comprising circuitry configured to identify a subrange of a frequency of the digital signal, the subrange including a dominant signal,
wherein the digital frequency translator and the spectral analysis engine are together arranged to recursively search an input frequency range of the input signal, and at each iteration of the recursive search to search a reduced frequency search range identified in a previous iteration of the recursive search as including the dominant signal, and to continue the recursive search until a frequency of the dominant signal has been estimated to a predetermined accuracy,
wherein the spectral analysis engine comprises a parametric engine configured to determine a dominant pole in the subrange identified in the previous iteration and to identify the subrange based on the dominant pole.

31. An apparatus as claimed in claim 30, in which the parametric engine is configured to estimate a same number of poles in the reduced frequency range in each iteration of the recursive search.

32. An apparatus as claimed in claim 30, in which the digital frequency translator comprises a mixer and a filter, and the apparatus is arranged to reduce a bandwidth of the filter at each pass.

33. An apparatus as claimed in claim 30, wherein the parametric engine comprises an angle calculator configured to calculate a phase angle of the dominant pole.

* * * * *